United States Patent
Okuno

(10) Patent No.: US 7,149,135 B2
(45) Date of Patent: Dec. 12, 2006

(54) MULTI CHIP PACKAGE TYPE MEMORY SYSTEM AND A REPLACEMENT METHOD OF REPLACING A DEFECT THEREIN

(75) Inventor: Takanobu Okuno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 10/879,093

(22) Filed: Jun. 30, 2004

(65) Prior Publication Data

US 2005/0105316 A1  May 19, 2005

(30) Foreign Application Priority Data

Oct. 30, 2003  (JP) .............................. 2003-371007

(51) Int. Cl.
*G11C 7/00* (2006.01)

(52) U.S. Cl. ............ 365/200; 365/185.09; 365/185.08; 365/230.03

(58) Field of Classification Search ................ 365/200, 365/185.09, 185.08, 230.03
See application file for complete search history.

(56) References Cited

U.S. PATENT DOCUMENTS

| | | | |
|---|---|---|---|
| 5,150,325 A * | 9/1992 | Yanagisawa et al. ....... 365/177 |
| 5,502,333 A * | 3/1996 | Bertin et al. ................. 257/685 |
| 5,689,460 A * | 11/1997 | Ooishi .................... 365/189.07 |
| 5,946,545 A * | 8/1999 | Bertin et al. .................... 438/15 |
| 5,987,623 A * | 11/1999 | Ushida ............................ 714/6 |
| 6,205,065 B1 * | 3/2001 | Sugibayashi ................ 365/200 |
| 6,246,115 B1 * | 6/2001 | Tang et al. .................. 257/706 |
| 6,343,038 B1 * | 1/2002 | Makino et al. ............. 365/203 |
| 6,434,065 B1 * | 8/2002 | Kobayashi et al. ......... 365/200 |
| 6,438,029 B1 | 8/2002 | Hiraki et al. |
| 6,449,208 B1 * | 9/2002 | Kono et al. .................. 365/226 |
| 6,532,184 B1 * | 3/2003 | Chun ......................... 365/203 |
| 6,538,924 B1 * | 3/2003 | Dono et al. ............. 365/185.08 |
| 6,542,414 B1 | 4/2003 | Hiraki et al. |
| 6,556,479 B1 * | 4/2003 | Makuta et al. ......... 365/185.09 |
| 6,586,823 B1 | 7/2003 | Ohmura et al. |
| 6,690,595 B1 * | 2/2004 | Srinivasan et al. ........... 365/49 |
| 6,696,867 B1 * | 2/2004 | Keeth et al. .................. 327/58 |
| 6,724,668 B1 * | 4/2004 | Ohmura et al. ............. 365/200 |
| 6,823,485 B1 * | 11/2004 | Muranaka .................... 714/719 |
| 6,829,181 B1 * | 12/2004 | Seitoh ........................ 365/201 |
| 6,845,043 B1 * | 1/2005 | Dono .................... 365/185.22 |
| 6,888,751 B1 * | 5/2005 | Makuta et al. ......... 365/185.09 |

(Continued)

FOREIGN PATENT DOCUMENTS

JP  407262792 A  * 10/1995

(Continued)

*Primary Examiner*—Viet Q. Nguyen
(74) *Attorney, Agent, or Firm*—Oblon, Spivak, McClelland, Maier & Neustadt, P.C.

(57) ABSTRACT

A multi chip package type memory system comprising a volatile memory chip including a volatile memory cell region configured to store a data and a redundant memory cell region configured to be used to replace a defect in the volatile memory cell region; a non-volatile memory chip including a non-volatile memory cell region, the non-volatile memory chip configured to output a first redundant information that is an information based on whether the volatile memory cell region in the volatile memory chip has the defect or not; and internal line connected between the volatile memory chip and the non-volatile memory chip, the internal line configured to transmit the first redundant information from the non-volatile memory chip to the volatile memory chip, and the internal line configured to transmit at least one of a data, an address signal, and a control signal from/to an outside circuit.

7 Claims, 12 Drawing Sheets

U.S. PATENT DOCUMENTS

| | | | |
|---|---|---|---|
| 6,967,878 B1 * | 11/2005 | Dono | 365/200 |
| 6,967,881 B1 * | 11/2005 | Sasaki et al. | 365/201 |
| 2002/0167849 A1 * | 11/2002 | Ohbayashi et al. | 365/189.09 |
| 2003/0037277 A1 | 2/2003 | Tamura | |

FOREIGN PATENT DOCUMENTS

| | | | |
|---|---|---|---|
| JP | 407287994 A | * | 10/1995 |
| JP | 2003-59288 | | 2/2003 |

\* cited by examiner

\* a defect address information and a redundant address information

MULTI CHIP PACKAGE TYPE MEMORY SYSTEM AND A REPLACEMENT METHOD OF REPLACING A DEFECT THEREIN

CROSS-REFERENCE TO RELATED APPLICATION

This application is based upon and claims the benefit of priority from the prior Japanese Patent Application No.2003-371007, filed Oct. 30, 2003, the entire contents of which are incorporated herein by reference.

BACKGROUND OF THE INVENTION

1. Field of the Invention

This present invention relates to a Multi Chip Package (MCP) type memory system and a replacement method of a replacing a defect therein. For example, the present invention can be used in a computer system, a memory card system, or a mobile phone system that is required to downsize.

2. Description of the Related Art

A recent computer system can be connected to a memory system that comprises of plural kinds of memory integrated circuits that are used as an external memory. When the memory system is used in the computer system (for instance, a mobile terminal), the memory system is strongly required to downsize. And also, recently the Multi Chip Package (MCP) type memory system that includes a plurality of memory chips in a single package is becoming used.

FIG. 10 shows the schematic diagram of the Multi Chip Package (MCP) type memory system. A plurality of memory chips 100 in the Multi Chip Package (MCP) type memory system are commonly connected to each other via a data line 102. The plurality of the memory chips 100 are commonly connected to each other via a control line 103. And also, each of the plurality of the memory chips 100 is connected to a chip select line 104 that supplies a chip select signal from an outside of the Multi Chip Package (MCP) type memory system.

Each of the plurality of the memory chips 100 includes a memory cell region 105, a redundant memory cell region 106 to replace a defect (at least one of a defect memory cell, a defect column line, and a defect world line) in the memory cell region 105, a laser blow type fuse circuit 107 to memorize information regarding the defect, an address decoder, and an I/O circuit.

FIG. 11 schematically shows how to replace a defect region in the memory cell region 105 with the redundant memory cell region 106. When the defect region is found in the memory cell region 105 at a test step to be performed before a packaging step, an address corresponding to the defect region is stored in the laser blow type fuse circuit 107. After that, when the address corresponding to the defect region is selected, non-defect region in the redundant memory cell region is selected, instead of selecting the defect region in the memory cell region 105, thereby replacing the defect region in the memory cell region 105 with the non-defect region in the redundant memory cell region 106. This technique is widely and usually used to replace the defect region with the non-defect region.

By the way, the Multi Chip Package (MCP) type memory system includes a plurality of the memory chips in a single package. Therefore, when the only one of the plurality of the memory chips is defect, even if the others are not defects, the Multi Chip Package (MCP) type memory system itself can not be used. Therefore, productivity rate of the Multi Chip Package (MCP) type memory system is determined by multiplications of productivity rates of all memory chips in the single package, thereby inevitably resulting in much lower productivity rate of the Multi Chip Package (MCP) type memory system than that of the single memory chip.

Conventionally, in order to make the productivity of the Multi Chip Package (MCP) type memory system higher, there is no effective method other than making productivity of all of the each memory chips higher. And also, it was very difficult to make the productivity of all memory chips each of which has different function greater.

A Japanese patent laid open kokai 2003-59288 shows a Multi Chip Package (MCP) type memory system that includes a dedicated line to serially transfer a redundant data among memory chips in order to replace a defect region after incorporating a plurality of memory chips in the Multi Chip Package (MCP) type memory system. However, it is practically difficult to use the technique stated in the Japanese patent laid open kokai 2003-59288 due to a high costs and an unstable operation of the MCP type memory system.

SUMMARY OF INVENTION

A first aspect of the present invention is providing a multi chip package type memory system comprising: a volatile memory chip including a volatile memory cell region configured to store a data and a redundant memory cell region configured to be used to replace a defect in the volatile memory cell region, a non-volatile memory chip including a non-volatile memory cell region, the non-volatile memory chip configured to output a first redundant information that is an information based on whether the volatile memory cell region in the volatile memory chip has the defect or not, and an internal line connected between the volatile memory chip and the non-volatile memory chip, the internal line configured to transmit the first redundant information from the non-volatile memory chip to the volatile memory chip, and the internal line configured to transmit at least one of a data, an address signal, and a control signal from/to an outside circuit.

A second aspect of the present invention is providing a multi chip package type memory system comprising: a plurality of volatile memory chips, each of which including a volatile memory cell region configured to store a data and a redundant memory cell region configured to be used to replace a defect in the volatile memory cell region, the redundant memory cell region including a redundant memory cell, a non-volatile memory chip including a non-volatile memory cell region, the non-volatile memory chip configured to output a first redundant information that is an information based on whether the volatile memory cell region has the defect in the volatile memory chip or not, and an internal line commonly connected to the plurality of volatile memory chips and the non-volatile memory chip, the internal line configured to transmit the first redundant information from the non-volatile memory chip to the plurality of volatile memory chips, the first redundant information including 1) a chip select/release information that indicates which the plurality of volatile memory chips should be selected, 2) a defect address information that indicates an address of a defect memory cell to be replaced, and 3) a redundant address information that indicates an address of the redundant memory cell to replace the defect memory cell, and the internal line configured to transmit at least one of a data, an address signal, and a control signal from/to an outside circuit.

A third aspect of the present invention is providing a replacement method of replacing a defect in a multi chip package type memory system including a non-volatile memory chip and a volatile memory chip that includes a volatile memory cell region and a redundant memory cell region and is a different chip from the non-volatile memory chip, comprising; reading out a first redundant information in the non-volatile memory chip to a first I/O circuit arranged in the non-volatile memory chip, transmitting the first redundant information stored in the first I/O circuit of the non-volatile memory chip to a second I/O circuit arranged in the volatile memory chip through a internal bus configured to transmit at least one of a data, an address signal, and a control signal from/to an outside circuit, and replacing the defect in the volatile memory cell region with the redundant memory cell region based upon the first redundant information.

A fourth aspect of the present invention is providing a replacement method of replacing a defect in a multi chip package type memory system including a non-volatile memory chip including a first I/O circuit and a plurality of volatile memory chips, each of which includes a second I/O circuit, a volatile memory cell region, and a redundant memory cell region, each of the plurality of volatile memory chips being a different chip from the non-volatile memory chip, comprising; reading out a first redundant information stored in the non-volatile memory chip to the first I/O circuit arranged in the non-volatile memory chip, transmitting the first redundant information in the first I/O circuit of the nonvolatile memory chip to the second I/O circuit arranged in at least one of the plurality of volatile memory chips through a internal bus configured to transmit at least one of a data, an address signal, and a control signal from/to an outside circuit, and replacing the defect in the volatile memory cell region with the redundant memory cell region based upon the first redundant information.

DETAILED DESCRIPTION OF THE INVENTION

First Embodiment

Figure 1:
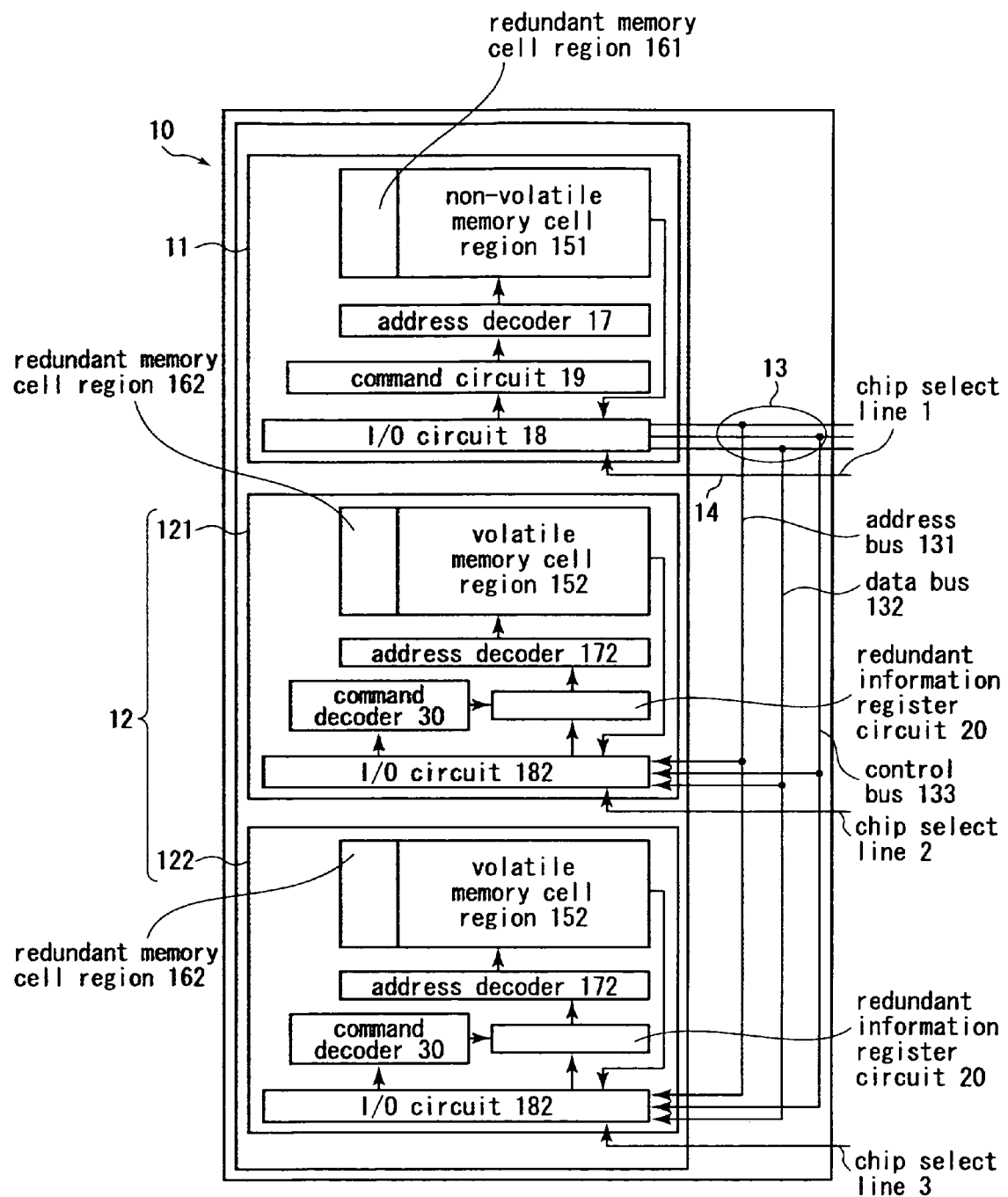
FIG. 1 shows a schematic block diagram of a multi chip package type memory system of a first embodiment in the present invention.

FIG. 1 shows a schematic block diagram of a multi chip package type memory system of a first embodiment in the present invention. The multi chip package type memory system 10 is used as a part of a memory system.

The multi chip package type memory system 10 is commonly connected to a system bus to which a CPU (Central Processing Unit), other memory system, and so on are connected. The multi chip package type memory system 10 of the first embodiment in the present invention includes plural kinds of memory chips that include a non-volatile memory chip 11 and volatile memory chips 121 and 122. It should be noted that each of the volatile memory chips 121 and 122 is a different chip each other and the non-volatile memory chip 11.

Hereinafter, for simplicity to explain, it is assumed that the multi chip package type memory system includes one non-volatile memory chip and two volatile memory chips, but it is not limited to it. For example, the multi chip package type memory system may include a plurality of non-volatile memory chips, or a number other than two of volatile memory chip.

The non-volatile memory chip 11 has a non-volatile memory cell region 151 that stores data, and a redundant memory cell region 161 that stores information that is based on whether the non-volatile memory cell region 151 has the defect or not. Typically, the information is an address information based on whether the non-volatile memory cell region 151 has the defect or not. When an address that indicates a defect memory cell (or a defect word line or a defect bit line) is inputted to the non-volatile memory chip 11, a memory cell (or a defect word line or a defect bit line) in the redundant memory cell region 161 is selected, instead of selecting a defect memory cell (or a defect word line or a defect bit line) in the non-volatile memory cell region 151.

And also, the non-volatile memory chip 11 has address decoders 17 that select a memory cell in the non-volatile memory cell region 151 or the redundant memory cell region 161, a command circuit 19 that outputs the command to the address decoders 17, and an I/O circuit 18 to/from which data is inputted/outputted. The non-volatile memory chip 11 may be, for instance, one of a EEPROM, a EPROM, a NOR type non-volatile memory, a NAND type non-volatile memory, a AND type non-volatile memory, a DINOR type non-volatile memory.

In the first embodiment of the present invention, the multi chip package type memory system 10 includes, but not limited to, two volatile memory chips 121 and 122.

Each of the volatile memory chips 12 has a volatile memory cell region 152 that stores data, and a redundant memory cell region 162 that stores information that is based on whether the volatile memory cell region 151 has the defect or not. Typically, the information is address information based on whether the volatile memory cell region 152 has the defect or not. When an address that indicates a defect memory cell (or a defect word line or a defect bit line) is inputted to the volatile memory chip 12, a memory cell (or a defect word line or a defect bit line) in the redundant memory cell region 162 is selected, instead of selecting a defect memory cell (or a defect word line or a defect bit line) in the volatile memory cell region 152.

And also, each of the volatile memory chips 121 and 122 has address decoders 17 that select a memory cell in the volatile memory cell region 152 or the redundant memory cell region 162, a redundant information register circuit 20, a command decoder 30, and an I/O circuit 18 to/from which data is inputted/outputted.

Each of the volatile memory chips 121 and 122 is, for instance, one of a static memory, a DRAM (Dynamic Random Access Memory), a pseudo SRAM, and a Synchronous DRAM.

And also, the multi chip package type memory system 10 includes an internal bus 13 that is connected to a system bus in a computer system (not shown). The internal bus 13 comprises an address bus 131, a data bus 132, and a control bus 133. In this first embodiment of the present invention, the internal bus 13 is connected to one non-volatile memory chip 11 and two volatile memory chips 121 and 122. That is, the one non-volatile memory chip 11 and the two volatile memory chips 12 share the address bus 131, a data bus 132, and a control bus 133.

A chip select line 1 on which a chip select signal is inputted from outside is commonly connected to the volatile memory chip 11 and the non-volatile memory chips 121 and 122. The chip select signal is inputted from outside, thereby selecting and accessing the volatile memory chip 11 (that is, one of read and write operations is performed) and the non-volatile memory chip 12 (that is, one of erase, read, and write operations is performed).

In case where a laser blow type fuse circuit to memorize a defect information is incorporated and used in the volatile memory chip in order to replace a defect region with a redundant region, the defect information can not be changed after blowing the fuse by laser beam. Instead, in case where non-volatile memory elements to memorize the defect information is incorporated and used in the volatile memory chip 12, a production cost is higher. Because manufacturing steps to form the non-volatile memory elements in the volatile memory chip must be added.

In the multi chip package type memory system of the first embodiment of in the present invention, the non-volatile memory chip 11 includes a regular non-volatile memory cell region 151, a redundant memory cell region 161, an address decoder 17, an internal bus 13, an I/O circuit 18 (Input/Output circuit), and a command circuit 19. The command circuit issues a command after a power supply is supplied (the multi chip package memory system is turned on). The command which is issued by the command circuit 19 is then inputted to and decoded at the address decoder 17, thereby selecting memory cells of the redundant memory cell region 161, and reading out a redundant information from the selected redundant memory cells.

In the first embodiment of the present invention, the redundant information is comprised of, but not limited to, 1) a chip select/release information that indicates which the volatile memory chips 121 and 122 should be selected or should not be selected (release), 2) a defect address information that indicates an address of a defect memory cell to be replaced, and 3) a redundant address information that indicates an address of a redundant memory cell to replace the defect memory cell. In order to replace the defect in the volatile memory chip, the redundant information is stored in the redundant memory cell region 161 in the volatile memory chip 11 in advance (at least before selecting the volatile memory chips 121 and 122).

It should be noted that the redundant information is information based on whether the volatile memory cell region 152 has a defect or not (For instance, information based on an address of the volatile memory cell to be replaced with the redundant memory cell). Therefore, the redundant information may be comprised of the only defect address information.

The redundant information that is read from the redundant memory cell region 161 is transmitted to the internal bus 13 via the I/O circuit 18. In the first embodiment of the present invention, the chip select/release information that is read from the redundant memory cell region 161 is transmitted to the address bus 131 via the I/O circuit 18. And also, the defect address information that is read from the redundant memory cell region 161 is transmitted to the data bus 132 via the I/O circuit 18.

In the multi chip package type memory system of the first embodiment of in the present invention, each of the volatile memory chips 121 and 122 includes a regular volatile memory cell region 152, a redundant memory cell region 162, an address decoder 172, an internal bus 13, an I/O circuit 182 (Input/Output circuit), a command decoder circuit 30, and a redundant information register circuit 20. The redundant information register circuit 20 is a circuit to store the redundant information transmitted from the non-volatile memory chip 11. Therefore, the redundant information register circuit 20 may be comprised of, for instance, a register circuit or a volatile memory cells. And also, the command decoder circuit 30 is a circuit to decode instructions and then activate the redundant information register circuit 20 in case where the volatile memory chip 12 is selected.

Figure 2:
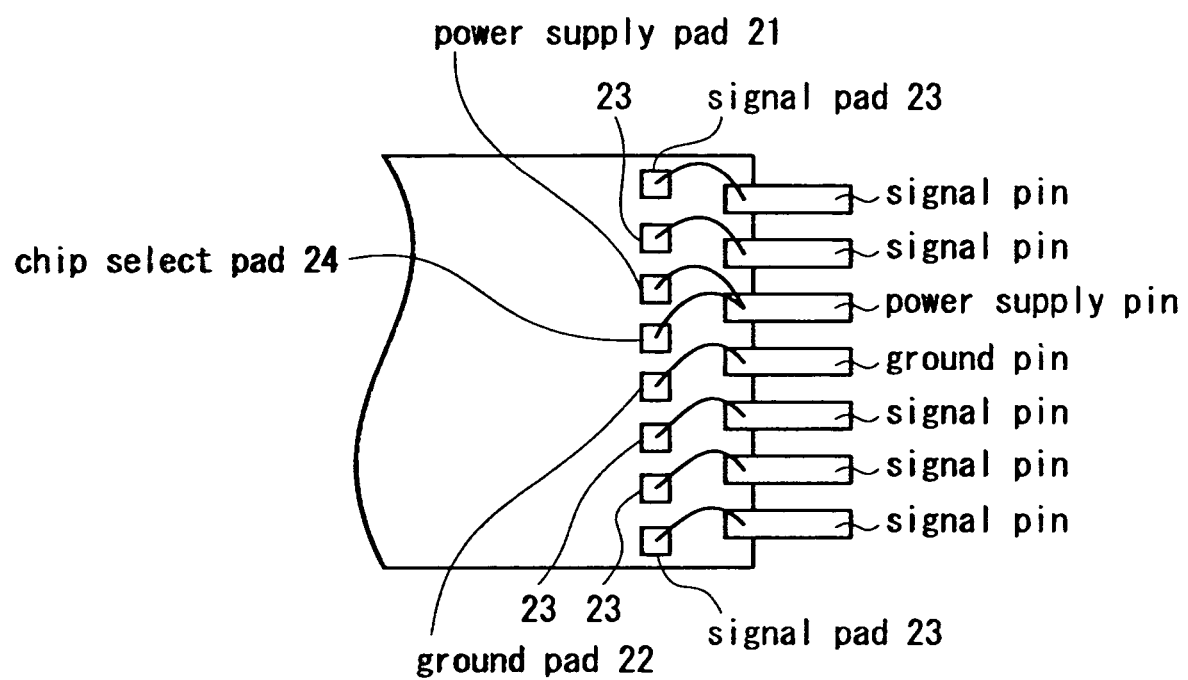
FIG. 2 shows an example of a pad portion in one of volatile memory chips 12 in the first embodiment of the present invention.

FIG. 2 shows an example of a pad portion in one of the two volatile memory chips 121 and 122 in the first embodiment of the present invention. As shown in FIG. 2, in the pad portion of one of the volatile memory chips 121 and 122, a power supply pad 21, a ground pad 22, signal pads 23, and a chip select pad 24 are arranged in a row. A power supply pin and a ground pin are arranged so as to be adjacent to the power supply pad 21 and the ground pad 22, respectively. The chip select pad 24 is connected to the power supply pin to distinguish one of the two volatile memory chips 121 and 122 from the other, thereby distinguishing each of the volatile memory chips 121 and 122. A chip select pad arranged in a pad portion of the other volatile memory chip 12 is connected to the ground pin (not shown).

Figure 3:
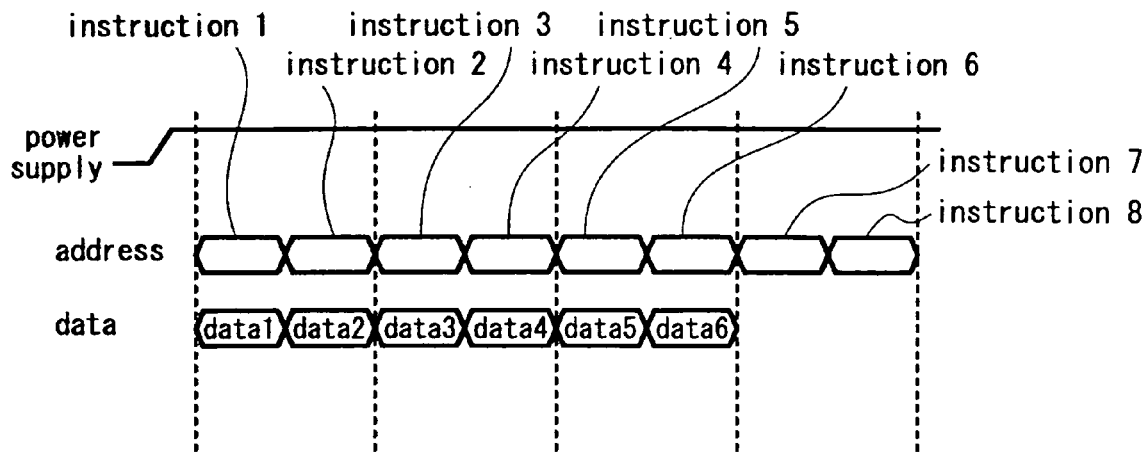
FIG. 3 shows a set of exemplary timing wave forms for operations of the multi chip package type memory system shown in FIG. 1 after supplying a power supply.

FIG. 3 shows a set of exemplary timing wave forms for operations of the multi chip package type memory system shown in FIG. 1 after supplying a power supply.

First of all, a power supply becomes H from L, that is, a power voltage is supplied to the multi chip package type memory system. Instructions 1 and 2 which are the chip select/release information and the redundant information respectively are then transferred from the non-volatile memory chip 11 to the internal bus 13. And then, data 1 and 2 which are the defect address information and the redundant address information are issued from the non-volatile memory chip 11 to the internal bus 13.

As shown in FIG. 1, the internal bus 13 is commonly connected to all of the chips (the non-volatile memory chip 11 and the volatile memory chips 121 and 122). However, one of the volatile memory chips 121 and 122 is selected by the instruction 1. A selected volatile memory chip is received the instruction 1, the data 1, and 2 necessary for replacing the defect memory cell with the redundant memory cell. The data 1 and 2 are stored in the redundant information register circuit 20 of the selected volatile memory chip 12. And then, the defect memory cell in the selected volatile memory chip 12 is replaced with the redundant memory cell. Similarly, instructions 3 to 6, and data 3 to 6 are issued. Thereby, all of the defect memory cells in any volatile memory chip 12 are replaced with the redundant memory cells. Instructions 7 and 8 to indicate an end of transmission are then issued from the volatile memory chip 11 to the volatile memory chips 121 and 122. After that, the multi chip package type memory system is regularly accessible.

Second Embodiment

In the first embodiment of the present invention, the redundant information that is based on whether a volatile memory cell region 152 has the defect or not is read out from the non-volatile memory chip 12 after applying a power voltage to the multi chip package type memory system. And then, one of the volatile memory chips 121 and 122 which includes the volatile memory cell region 152 is selected. After replacing all the defects to be replaced, an instruction (instructions 7 and 8 shown in FIG. 3) to indicate an end of transmission are issued.

In case where it is not needed to replace a defect in the volatile memory chip by using the redundant information stored in the non volatile memory chip, a control pad that is fixed at a predetermined voltage is provided in the non volatile memory chip in order to make the transmission of the redundant information invalid. The control pad is connected to a power supply voltage VDD or a ground voltage GND by bonding wire, thereby making the transmission invalid. The control pad may be a dedicated pad, or be commonly used as the other pad.

Third Embodiment

In the second embodiment of the present invention, the control pad is provided in the non volatile memory chip and connected to a power supply voltage VDD or a ground supply voltage GND by bonding wire in order to make the transmission invalid. On the other hand, the control pad in a third embodiment of the present invention is provided in the volatile memory chip and connected to a power supply voltage VDD or a ground voltage GND by bonding wire, thereby making the transmission invalid. The control pad may be a dedicated pad, or be commonly used as the other pad. And also, instead of providing the control pad, a blow fuse which is provided in the volatile memory chip may be provided in order to make the transmission invalid. For example, when a predetermined blow fuse is cut, the transmission is made invalid.

Fourth Embodiment

In the multi chip package type memory system in the first to third embodiments of the present invention, all of the redundant information is transferred from the non volatile memory chip to the volatile memory chip after supplying the supply voltage to the multi chip package type memory system. On the other hand, in the multi chip package type memory system in a fourth embodiment of the present invention, a part of the redundant information is transferred from the non-volatile memory chip to the volatile memory chip. That is, in the fourth embodiment of the present invention, the volatile memory chip uses not only a first redundant information transferred from the non volatile memory chip but also a second redundant information stored in a fuse circuit in order to replace the defect of the volatile memory chip.

Figure 4:
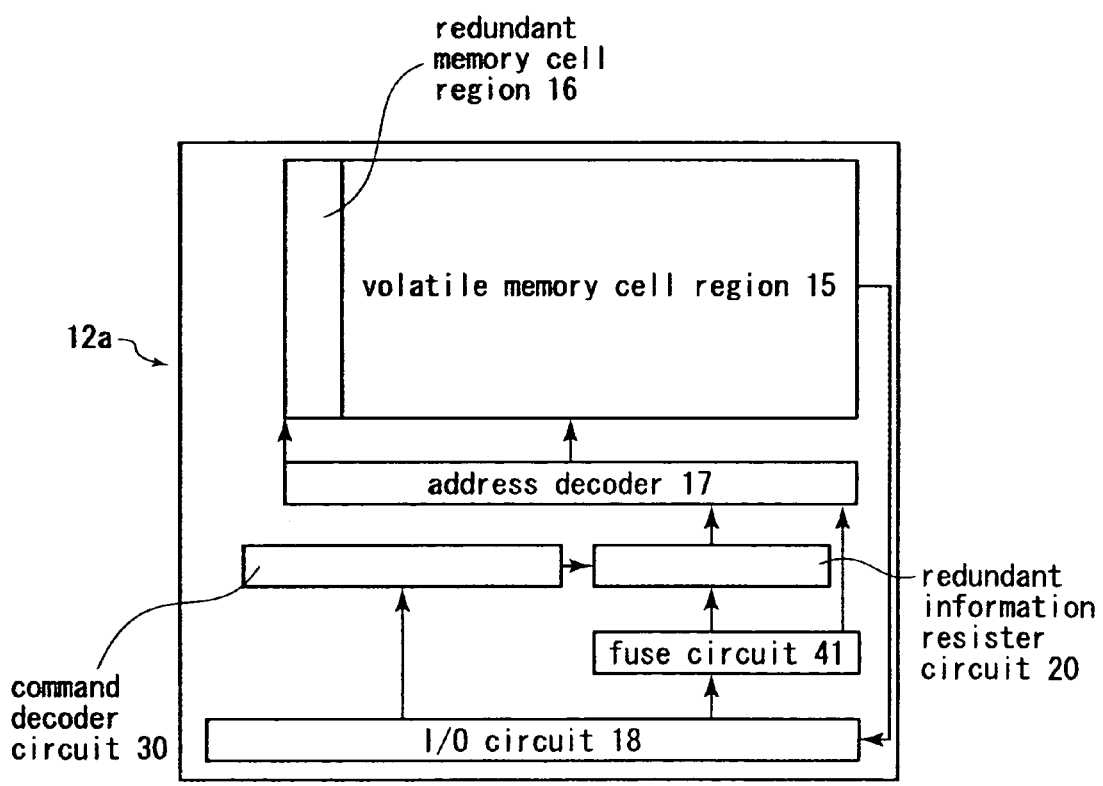
FIG. 4 shows a schematic block diagram of a volatile memory chip in the multi chip package type memory system of a fourth embodiment in the present invention.

FIG. 4 shows a schematic block diagram of a volatile memory chip in the multi chip package type memory system of the fourth embodiment in the present invention. The multi chip package type memory system of the fourth embodiment in the present invention is deferent from that of the first embodiment above stated in that a volatile memory chip in the fourth embodiment includes 1) a fuse circuit that stores a redundant information based on a defect which was found before molding a plurality of semiconductor chips and 2) a redundant information resister circuit that stores a redundant information based on a defect which was found after molding the plurality of the semiconductor chips and transmitted from a non volatile memory chip.

As shown in FIG. 4, the volatile memory chip 12a includes a volatile memory cell region 15 to store data, a redundant memory cell region 16 that is configured to replace a defect in the volatile memory cell region 15, if any. And the volatile memory chip 12a also includes an address decoder circuit 17, a command decoder 30, a redundant information resistor circuit 20, a fuse circuit 41, and an I/O circuit 18. The address decoder circuit 17 selects a memory cell in the volatile memory cell region 15 or the redundant memory cell region 16 identified by an address signal.

The fuse circuit 41 stores a redundant information based on a defect which was found before molding a plurality of semiconductor chips. If the defect in the volatile memory cell region 15 was found before molding a plurality of the semiconductor chips (packaging step), a second redundant information based on the defect is stored in the fuse circuit. The redundant information, if any, is used to replace the defect in the volatile memory cell region 15 with a memory cell, a word line, or a bit line in the redundant memory cell region 16.

The redundant information resistor circuit 20, as stated in the foregoing embodiment, stores a first redundant information that is found after molding the plurality of the semiconductor chips and transmitted from the non volatile memory chip. If the defect in the volatile memory cell region 15 was found after molding the plurality of the semiconductor chips, a first redundant information based on the defect is stored in a non-volatile memory chip (not shown in FIG. 4) and transferred to the redundant information resistor circuit 20 in the volatile memory chip 12a therefrom though an internal bus (not shown in FIG. 4). The command decoder 30 issues a command to the redundant information resistor circuit 20. In accordance with the command issued from the command decoder 30, and based upon the first redundant information transferred from the non volatile memory chip, the redundant information resistor circuit 20 replaces the defect in the volatile memory cell region 15 with a memory cell, a word line, or a bit line in the redundant memory cell region 16 that are not going to be assigned and used by the fuse circuit 41.

Usually, most of the defects in the volatile memory cell region 152 are found at a test step that is going to be performed before the packaging step. Therefore, in the fourth embodiment of the present invention, the redundant information based on the defect that was found before the packaging step are stored in the fuse circuit 41 that is located in the volatile memory chip 12*a*, thereby being to able to reduce an amount of a redundant information that is going to be transferred from the non-volatile memory chip 11 to the volatile memory chip 12*a*.

Fifth Embodiment

In the foregoing embodiments of the present invention, the redundant information that was found after the packaging step is stored in an unused region in the redundant memory cell region 162 in order to replace the defect in the volatile memory 162. The defect in the volatile memory chip 152 can be replaced by use of less capacity of the redundant memory cell region 162 because the defect that is going to happen is usually able to be replaced by providing one set address signal, for instance, an address to identify one bit (one memory cell), one bit line (one column), or one word line. Therefore, in a fifth embodiment of the present invention, an additional redundant memory cell region is provided in order to replace the defect that was found before the packaging step.

Figure 5:
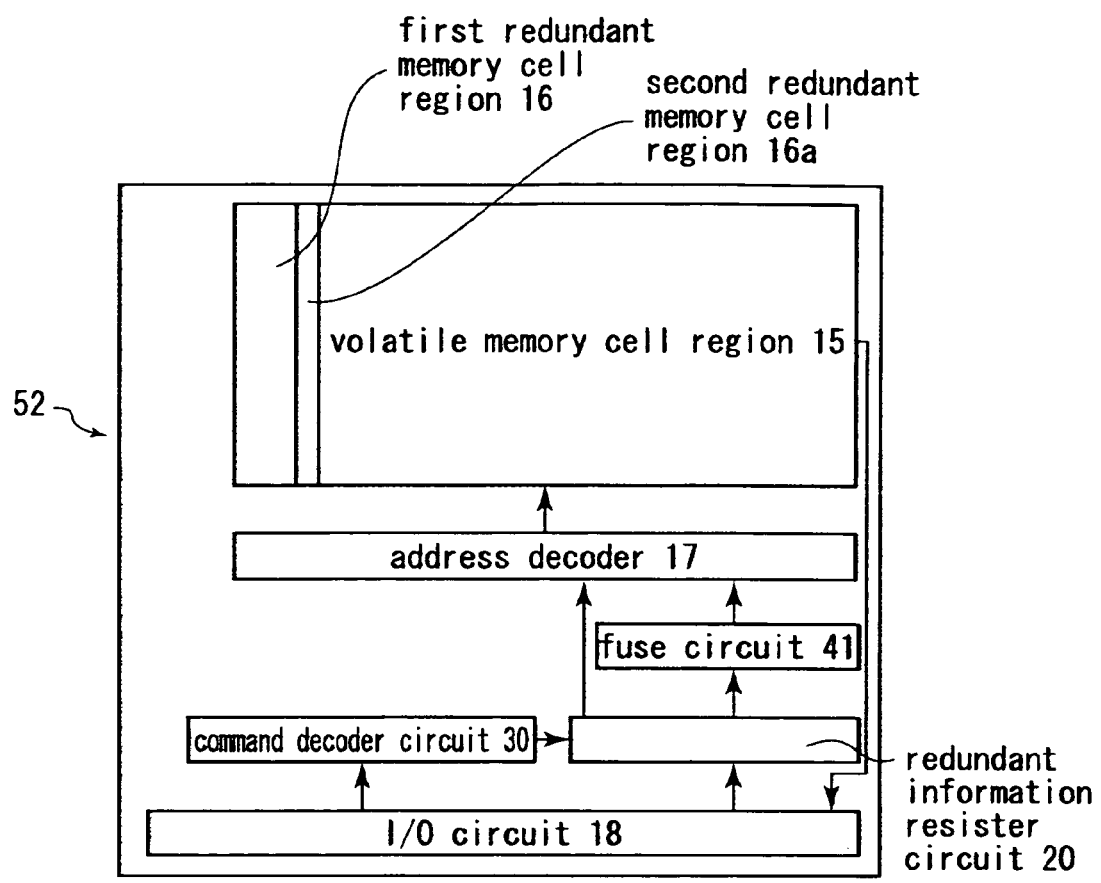
FIG. 5 shows a schematic block diagram of a volatile memory chip in the multi chip package type memory system of a fifth embodiment in the present invention.
Figure 6:
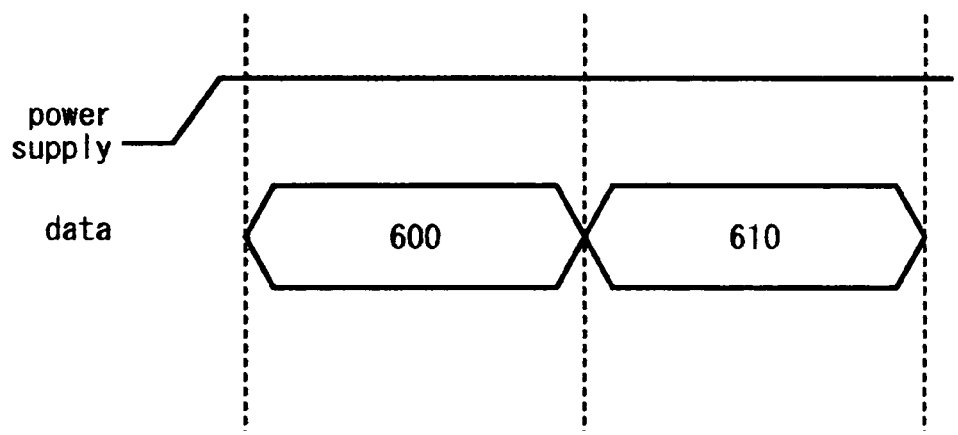
FIG. 6 shows a set of exemplary timing wave forms for operations of the multi chip package type memory system shown in FIG. 5 after supplying a power supply.

FIG. 5 shows a schematic block diagram of a volatile memory chip in the multi chip package type memory system of the fifth embodiment in the present invention. FIG. 6 shows a set of exemplary timing wave forms for operations of the multi chip package type memory system shown in FIG. 5 after supplying a power supply.

As shown in FIG. 5, the fifth embodiment of the present invention is different from the foregoing embodiments of the present invention in that a second redundant memory cell region 16*a* is provided in the volatile memory chip 52 in order to replace the defect that was found after the packaging step. It should be noted that a memory cell in the second redundant memory cell region 16*a* is designated by the one set address signal, for instance, an address to identify one bit (one memory cell), one bit line (one column), or one word line.

In the multi chip package type memory system of the fifth embodiment in the present invention, the defect that was found in the volatile memory cell region 15 after the packaging step is replaced by use of a second redundant memory cell region 16*a*. A memory cell in the second redundant memory cell region 16*a* is selected by use of a first redundant information stored in a redundant information resistor circuit 20. And also, the first redundant information is transferred from a non-volatile memory chip (not shown in FIG. 5) to the redundant information resistor circuit 20 via an internal bus 13 (shown in FIG. 1) and an I/O circuit 18. In accordance with a command from a command decoder circuit 30, the redundant information resistor circuit 20 outputs the first redundant information to an address decoder 17 in order to replace the defect.

On the other hand, the defect that was found in the volatile memory cell region 15 before the packaging step is, as stated in the foregoing embodiments of the present invention, replaced by use of a first redundant memory cell region 16. A memory cell in the first redundant memory cell region 16 is selected by use of a second redundant information stored in a fuse circuit 41.

As shown in FIG. 6, after supplying a power supply, a data 600 is transferred from the non-volatile memory chip 121 (shown in FIG. 1) to the volatile memory chip. A data 610 is then transferred from the non-volatile memory chip 122 (shown in FIG. 1) to the volatile memory chip. Each of the data 600 and 610 comprises 1) a chip select/release information that indicates which the plurality of volatile memory chips should be selected and 2) a defect address information that indicates an address of a defect memory cell to be replaced. Therefore, it is not needed to transfer a redundant address to replace the defect memory cell, thereby being able to reduce the amount of data to be transferred via the internal bus 13 (shown in FIG. 1).

Sixth Embodiment

In the multi chip package type memory system of the foregoing embodiments in the present invention, the chip select signal is transferred from the non-volatile memory chip 11 to the volatile memory chips 121 and 122 via the address bus 131 in order to select one of the volatile memory chips 121 and 122. However, the multi chip package type memory system in a sixth embodiment of the present invention is deferent from the foregoing embodiments in that two dedicated lines are provided and a chip select signal is transferred from the non-volatile memory chip 11 to the volatile memory chips 121 and 122 via the two dedicated lines to transfer the chip select signal.

Figure 7:
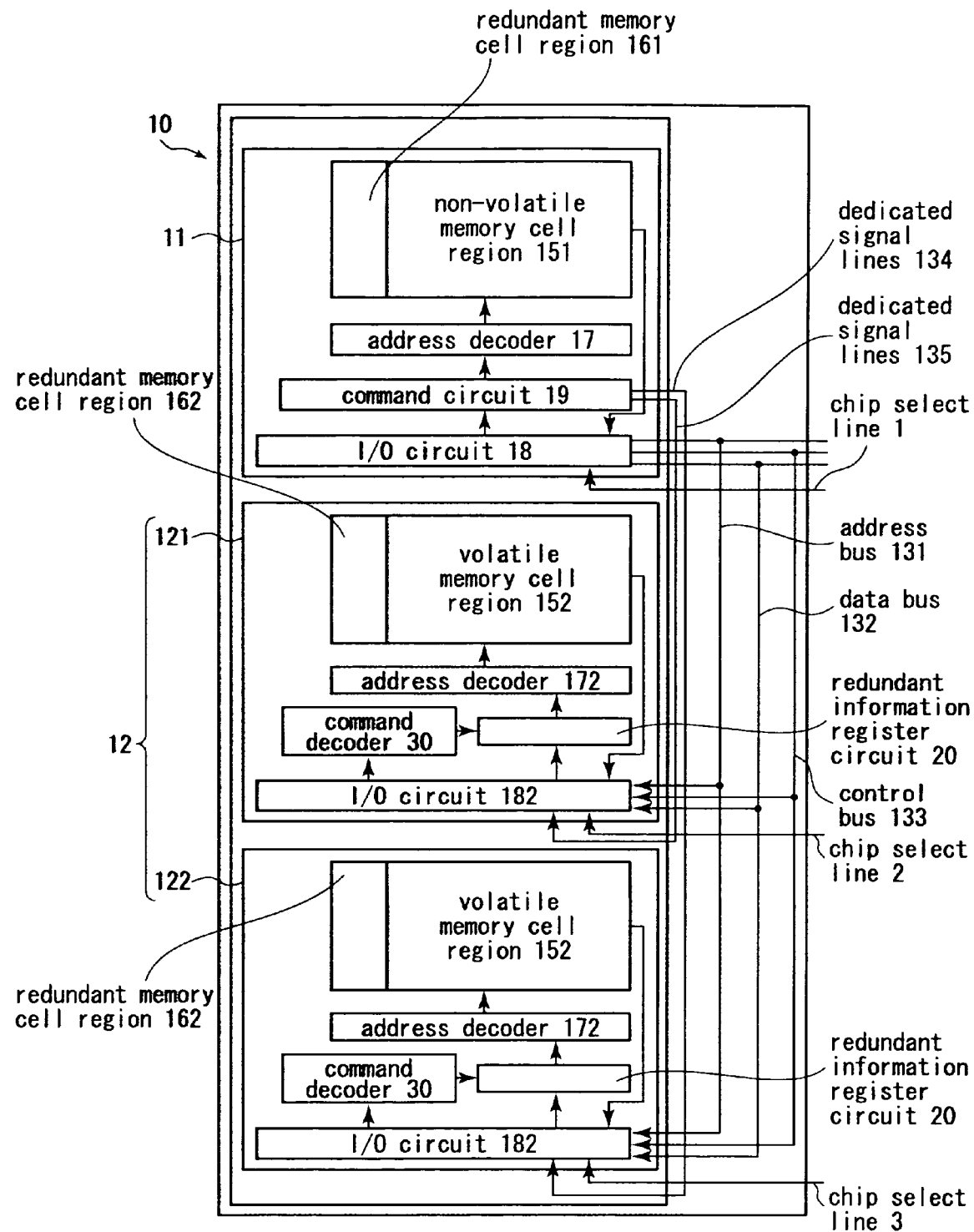
FIG. 7 shows a schematic block diagram of the multi chip package type memory system of a sixth embodiment in the present invention.
Figure 8:
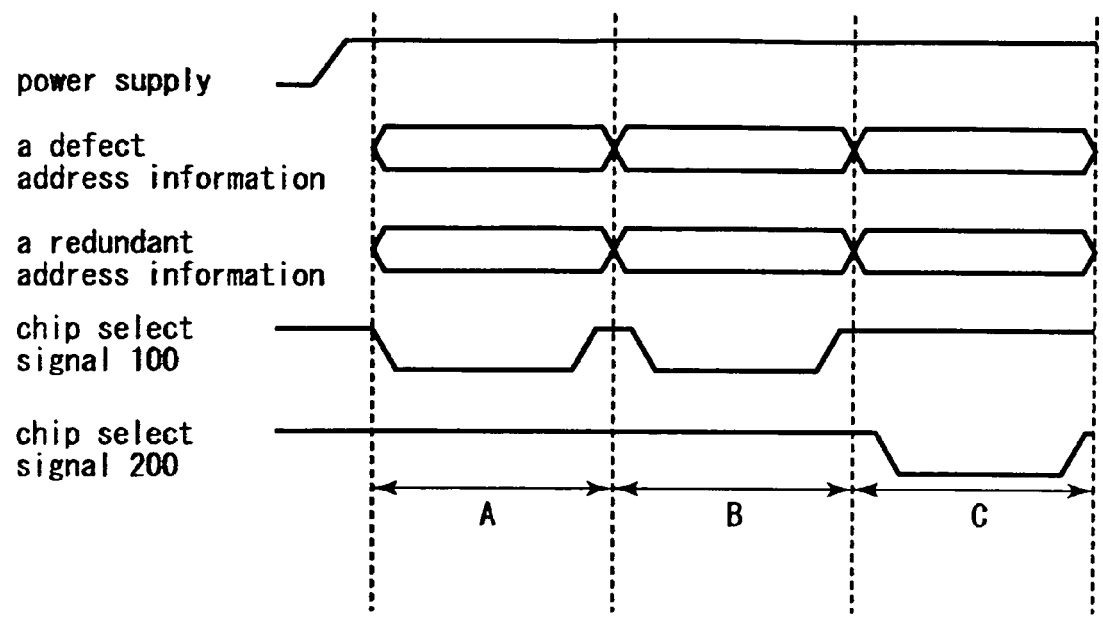
FIG. 8 shows a set of exemplary timing wave forms for operations of the multi chip package type memory system shown in FIG. 7 after supplying a power supply.

FIG. 7 shows a schematic block diagram of a multi chip package type memory system of the sixth embodiment in the present invention. FIG. 8 shows a set of exemplary timing wave forms for operations of the multi chip package type memory system shown in FIG. 7 after supplying a power supply thereto.

As shown in FIG. 7, in the sixth embodiment of the present invention, a dedicated signal line 134 is provided and connected between a non-volatile memory chip 11 and a volatile memory chip 121 And also, a dedicated signal line 135 is provided and connected between the non-volatile memory chip 11 and a volatile memory chip 122. The chip select signal is transferred from an I/O circuit 18 in the non-volatile memory chip 11 to an I/O circuit 182 in the volatile memory chip 121 or 122, thereby selecting one of the volatile memory chips 121 and 122 that is identified by the chip select signal. The other portion of the multi chip package type memory system of the sixth embodiment will be omitted because it is similar to that of the first embodiment in the present invention.

As shown in FIG. 8, after supplying a power voltage, a chip select signals 100 and 200 are transferred from the non-volatile memory chip 11 to the volatile memory chips 121 and 122 via the dedicated lines 134 and 135, respectively. One of the volatile memory chips 121 and 122 is then selected by the chip select signals 100 and 200. It is assumed that the volatile memory chip is selected in case where the chip select signal is a low level. In periods of time A and B (in case where the chip select signal 100 is a low level), the volatile memory chip 121 is selected, and in the period C (in case where the chip select signal 200 is a low level), the volatile memory chip 122 is selected.

In the periods of time A and B, a defect address information is also transferred from the non-volatile memory chip 11 to the volatile memory chip 121 via an address line 131. And a redundant address information is also transferred from the non-volatile memory chip 11 to the volatile memory chip 121 via a data line 132.

In the period of time C, a defect address information is also transferred from the non-volatile memory chip 11 to the volatile memory chip 122 via an address line 131. And a redundant address information is also transferred from the non-volatile memory chip 11 to the volatile memory chip 122 via a data line 132. Thereby, a fault operation of the volatile memory chips 121 and 122 can be prevented.

In this case, the defect address information is information that indicates an address of a defect memory cell to be replaced. And also, the redundant address information is information that indicates an address of a redundant memory cell to replace the defect memory cell.

Seventh Embodiment

In the multi chip package type memory system of the sixth embodiment in the present invention, the defect address information and the redundant address information are transferred via the address line 131 and the data line 132, respectively. On the other hand, in a seventh embodiment of the present invention, a defect address information and a redundant address information are transferred via only address line 131.

Figure 9:
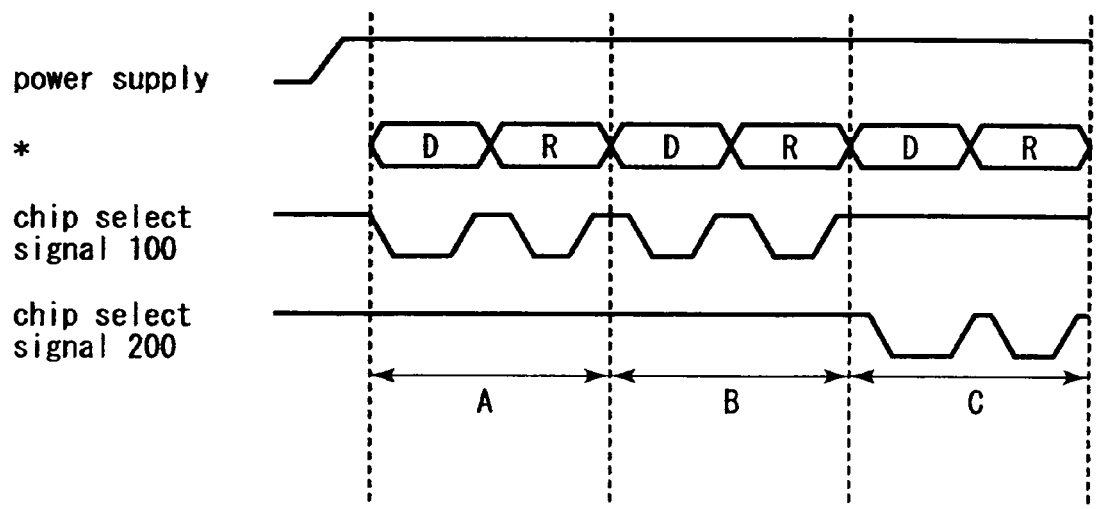
FIG. 9 shows another set of exemplary timing wave forms for operations of the multi chip package type memory system after supplying a power supply.
Figure 10:
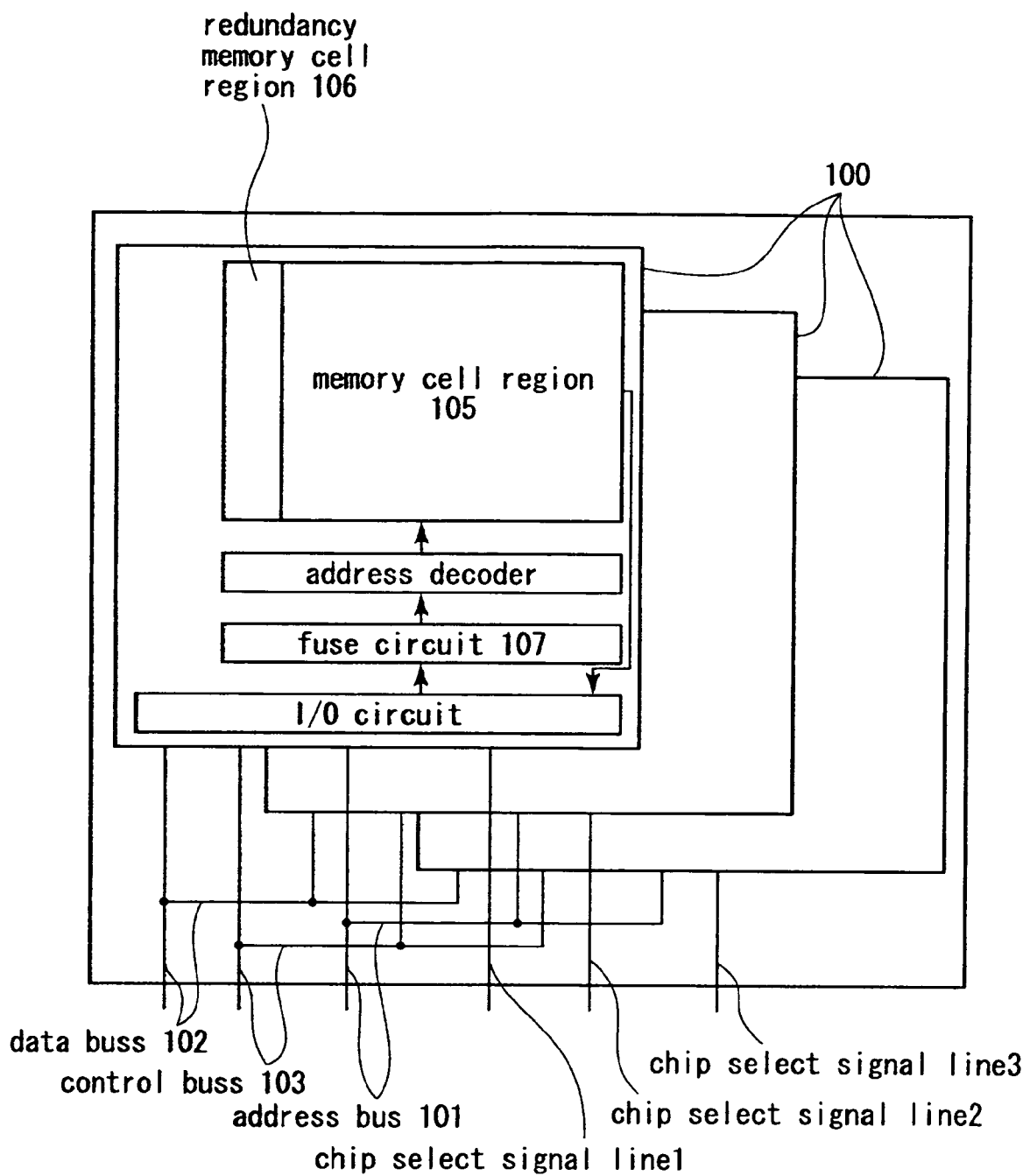
FIG. 10 shows a conventional and schematic block diagram of a multi chip package type memory system.
Figure 11:
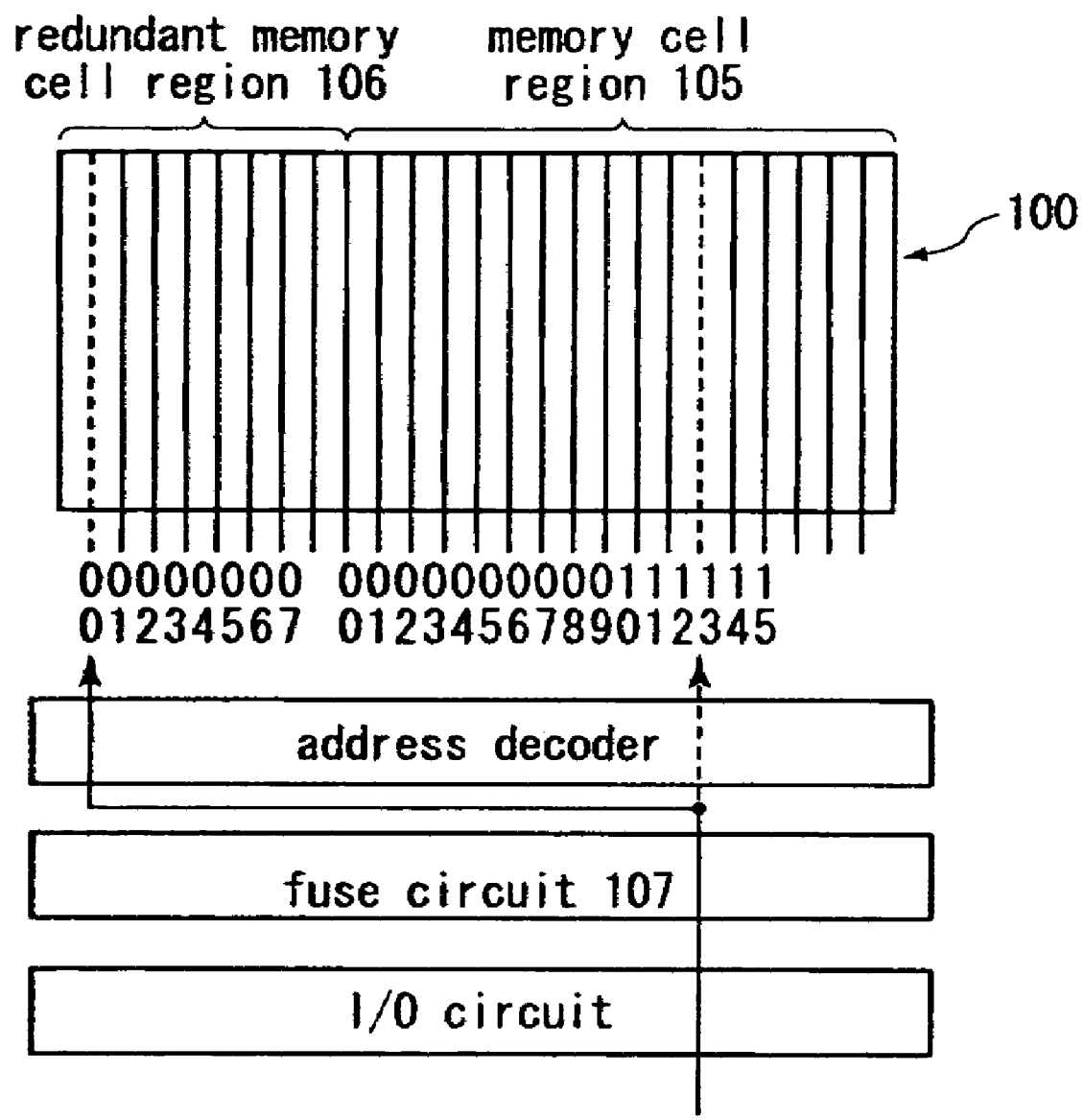
FIG. 11 shows a schematic diagram to explain how to replace the defect region in a volatile memory region with a redundant memory cell region therein.

As shown in FIG. 9, after supplying a power voltage to the multi chip package type memory system, a chip select signals 100 and 200 are transferred from the non-volatile memory chip 11 to the volatile memory chips 121 and 122. One of the volatile memory chips 121 and 122 is then selected by the chip select signals 100 and 200. It is assumed that the volatile memory chip is selected in case where the chip select signal is a low level. In periods of time A and B (in case where the chip select signal 100 is a low level), the volatile memory chip 121 is selected, and in the period of time C (in case where the chip select signal 200 is a low level), the volatile memory chip 122 is selected.

In the periods of time A and B, the defect address information D is transferred from the non-volatile memory chip 11 to the volatile memory chip 121 via an address line 131 during a period of time when the chip select signal 100 is a low level. And then, the redundant address information R is transferred from the non-volatile memory chip 11 to the volatile memory chip 121 via an address line 131 during a period of time when the chip select signal 100 is a low level.

In the period of time C, the defect address information D is transferred from the non-volatile memory chip 11 to the volatile memory chip 122 via an address line 131 during a period of time when the chip select signal 100 is a low level. And then, the redundant address information is transferred from the non-volatile memory chip 11 to the volatile memory chip 122 via an address line 131. Thereby, a fault operation of the volatile memory chips 121 and 122 can be prevented.

In the seventh embodiment of the present invention, the defect address information and the redundant address information are transferred via only address line 131, but it is not limited to it. For example, the defect address information and the redundant address information may be transferred via only data line 132.

Figure 12:
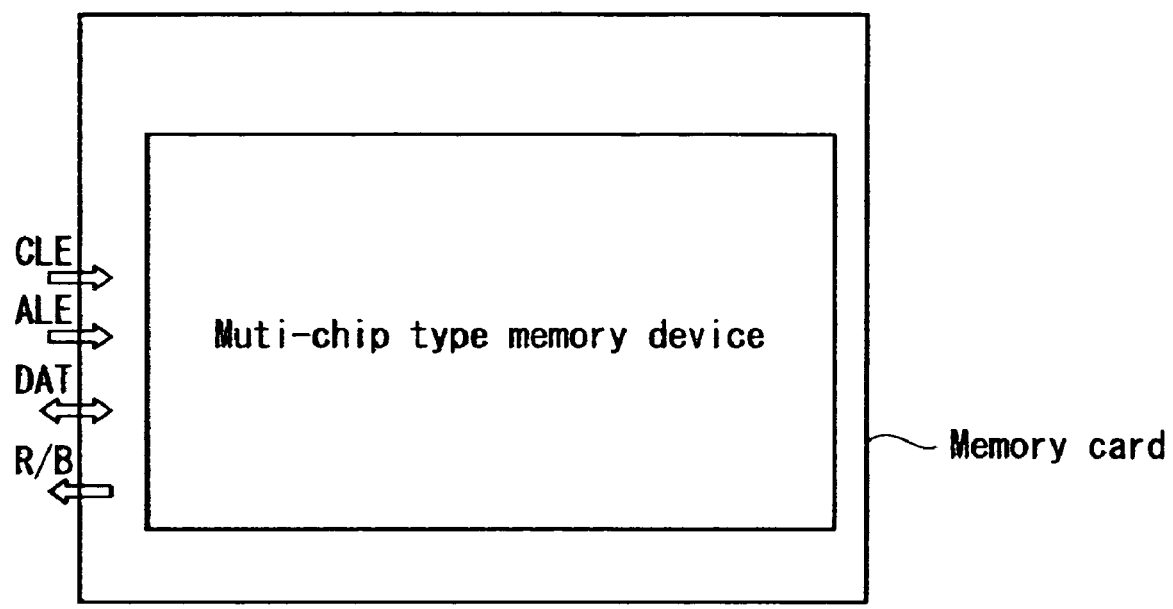
FIG. 12 shows a diagram of a memory card in which a multi chip package type memory device is arranged.

We will explain about applications having an above mentioned multi chip package type memory system. FIG. 12 shows a memory card having the above mentioned multi chip package type memory. As shown in FIG. 12, the multi chip package type memory receives/outputs predetermined signals and data from/to an external device (not shown).

A signal line (DAT), a command line enable signal line (CLE), an address line enable signal line (ALE) and a ready/busy signal line (R/B) are connected to the memory card having the above mentioned multi chip package type memory system. The signal line (DAT) transfers data, address or command signals. The command line enable signal line (CLE) transfers a signal which indicates that a command signal is transferred on the signal line (DAT). The address line enable signal line (ALE) transfers a signal which indicates that an address signal is transferred on the signal line (DAT). The ready/busy signal line (R/B) transfers a signal which indicates whether the memory device is ready or not.

Figure 13:
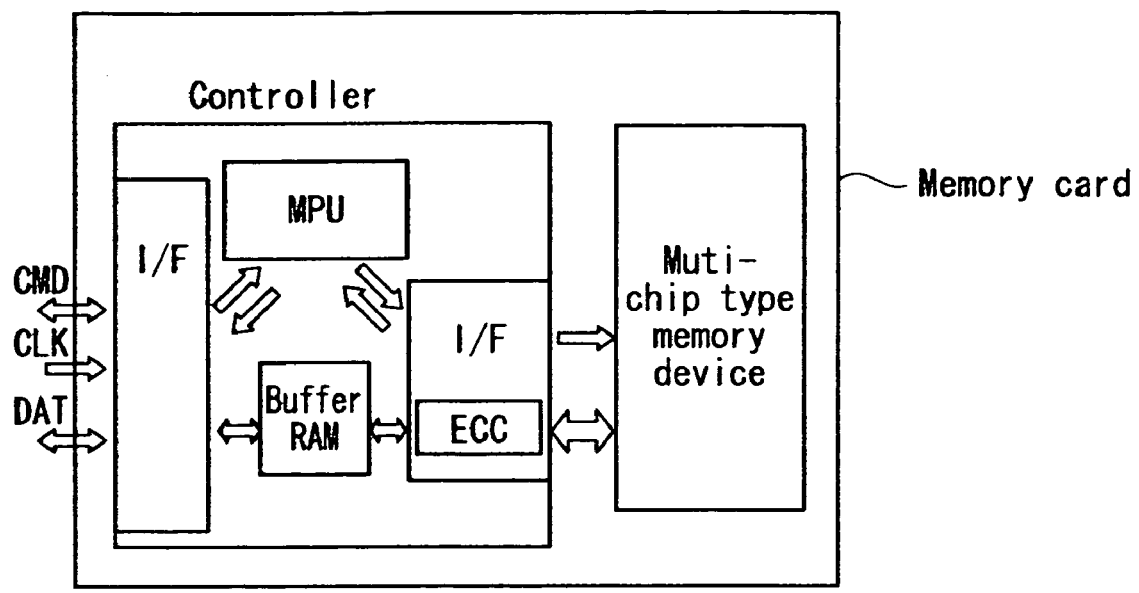
FIG. 13 shows a diagram of a memory card in which a multi chip package type memory device and a controller are arranged.

Another example of a memory card is shown in FIG. 13. The memory card shown in FIG. 13 differs from the memory card presented in FIG. 12 in that the memory card includes a controller which controls the multi chip package type memory and receives/transfers predetermined signals from/to an external device (not shown).

The controller includes an interface unit (I/F), a micro processor unit (MPU), a buffer RAM and an error correction code unit (ECC). The interface unit (I/F) receives/outputs predetermined signals from/to an external device (not shown). The micro processor unit converts a logical address into a physical address. The buffer RAM stores data temporarily. The error correction code unit generates an error correction code. And a command signal line (CMD), a clock signal line (CLK) and a signal line (DAT) are connected to the memory card.

Although we explain about the memory cards as shown above, the number of the control signal lines, bit width of the signal line (DAT) and a circuit construction of the controller could be modified suitably.

Figure 14:
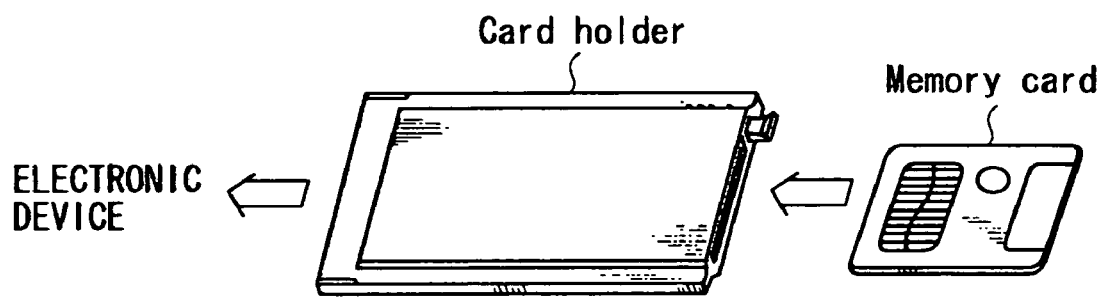
FIG. 14 shows a diagram of a card holder to which a memory card is inserted.

Another application is shown in FIG. 14. A memory card holder to which the memory card is inserted, is shown in FIG. 14. And the card holder is connected to electronic device (not shown). The card holder may have a part of the functions of the controller.

Figure 15:
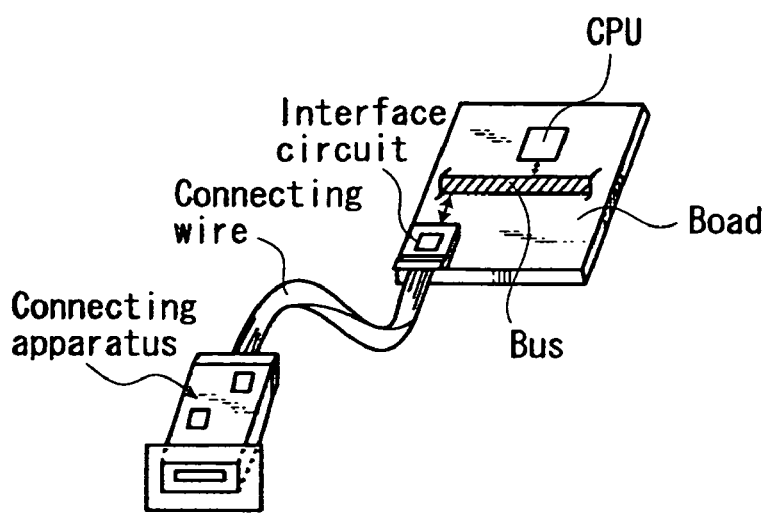
FIG. 15 shows a diagram of a connecting apparatus, a board, and a connecting wire.

Another application is shown in FIG. 15. As shown in FIG. 15, the memory card or the card holder to which the memory card is inserted is inserted to a connecting apparatus. The connecting apparatus is connected to a board via a connecting wire and an interface circuit. The board has a CPU (Central Processing Unit) and a bus.

Figure 16:
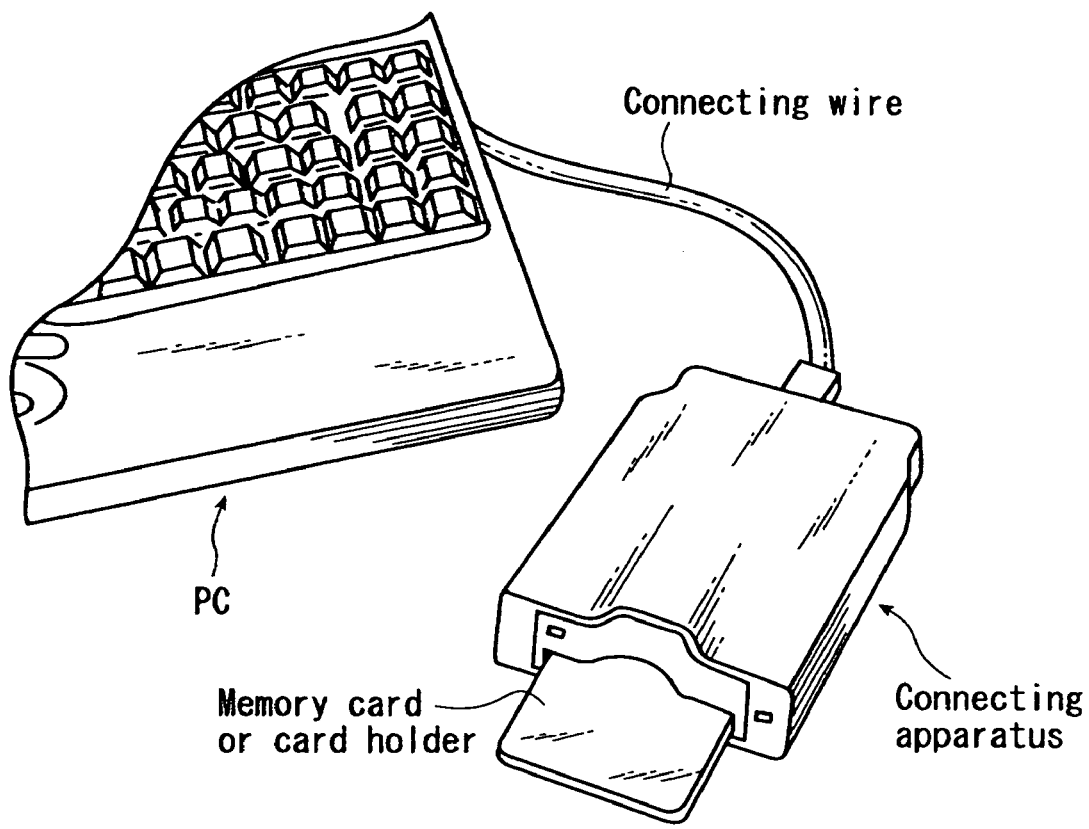
FIG. 16 shows a diagram of a PC, a connecting apparatus, and a connecting wire.

Another application is shown in FIG. 16. As shown in FIG. 16, the memory card or the card holder to which the memory card is inserted is inserted to a connecting apparatus. The connecting apparatus is connected to PC (Personal Computer) via connecting wire.

Figure 17:
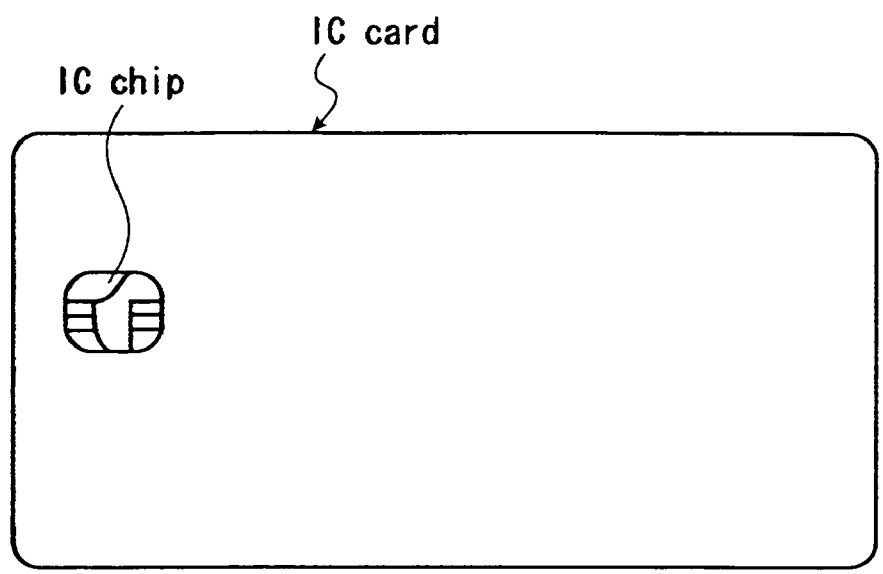
FIG. 17 shows a diagram of an IC chip including a multi chip package type memory deivce, and an IC card on which the IC chip is allocated.
Figure 18:
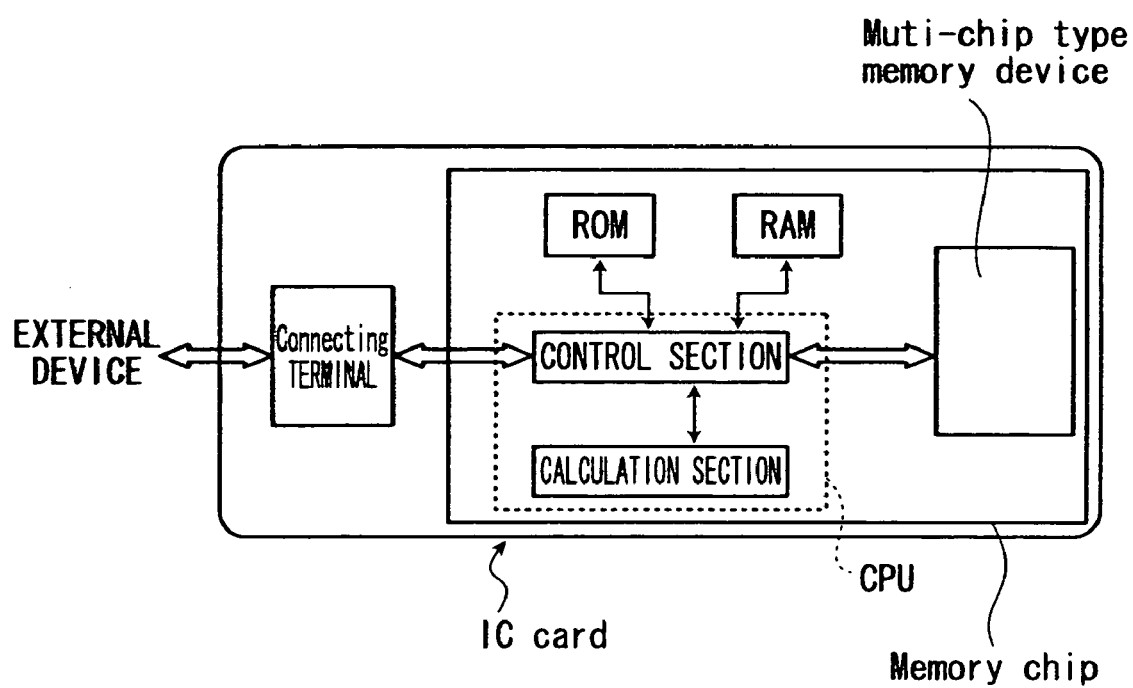
FIG. 18 shows a schematic diagram of an IC card and an IC chip.

Another application is shown in FIGS. 17 and 18. As shown in FIG. 17, An IC chip that includes the above mentioned multi chip type memory device is located on an IC card that is made of plastic or something like that. FIG. 18 shows a detail block diagram of the IC card and the IC chip presented in FIG. 18. The IC chip has a connecting terminal that is configured to connect to an external device (not shown), and a memory chip that includes the above mentioned multi chip type memory device, a ROM, a RAM, and a CPU. The CPU contains a calculation section and a control section that is configured to access to the multi chip type memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. A multi chip package type memory system comprising:
   a plurality of volatile memory chips, each of which including a volatile memory cell region configured to store a data and a redundant memory cell region configured to be used to replace a defect in the volatile memory cell region, the redundant memory cell region including a redundant memory cell,
   a non-volatile memory chip including a non-volatile memory cell region, the non-volatile memory chip configured to output a first redundant information that is an information based on whether the volatile memory cell region has the defect in the volatile memory chip or not, and
   an internal line commonly connected to the plurality of volatile memory chips and the non-volatile memory chip, the internal line configured to transmit the first redundant information from the non-volatile memory chip to the plurality of volatile memory chips, the first redundant information including 1) a chip select/release information that indicates which the plurality of volatile memory chips should be selected, 2) a defect address information that indicates an address of a defect memory cell to be replaced, and 3) a redundant address information that indicates an address of the redundant memory cell to replace the defect memory cell, and the internal line configured to transmit at least one of a data, an address signal, and a control signal from/to an outside circuit.

2. The multi chip package type memory system according to claim 1, each of the plurality of volatile memory chips further comprising a redundant information resister circuit storing the first redundant information transferred from the non-volatile memory chip.

3. The multi chip package type memory system according to claim 1, each of the plurality of volatile memory chips further comprising a fuse circuit that stores a second redundant information.

4. The multi chip package type memory system according to claim 3, wherein the first redundant information is an information based on a defect that was found after a packaging step, and the second redundant information is an information based on a defect that was found before the packaging step.

5. The multi chip package type memory system according to claim 1, the non-volatile memory chip further comprising a command circuit that issues a command for instructing to transfer the first redundant information from the non-volatile memory chip to the volatile memory chip.

6. A memory card including the multi chip package type memory system recited in claim 1.

7. A memory card including the multi chip package type memory system recited in claim 1 and a controller which controls the multi chip package type memory system.

* * * * *